(12) United States Patent
Graninger et al.

(10) Patent No.: US 11,722,135 B2
(45) Date of Patent: Aug. 8, 2023

(54) SUPERCONDUCTING AC SWITCH SYSTEM

(71) Applicants: Aurelius L. Graninger, Sykesville, MD (US); Aaron A. Pesetski, Gambrills, MD (US); Joel D. Strand, Ellicott City, MD (US)

(72) Inventors: Aurelius L. Graninger, Sykesville, MD (US); Aaron A. Pesetski, Gambrills, MD (US); Joel D. Strand, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 41 days.

(21) Appl. No.: 17/375,210

(22) Filed: Jul. 14, 2021

(65) Prior Publication Data

US 2023/0019017 A1    Jan. 19, 2023

(51) Int. Cl.
*H03K 17/92* (2006.01)
*H01F 7/06* (2006.01)

(52) U.S. Cl.
CPC ............. *H03K 17/92* (2013.01); *H01F 7/064* (2013.01)

(58) Field of Classification Search
CPC .................. H03K 17/92; H03K 17/002
See application file for complete search history.

(56) References Cited

U.S. PATENT DOCUMENTS

| | | | | |
|---|---|---|---|---|
| 4,107,554 A | * | 8/1978 | Yao .................. | H03K 17/92 327/528 |
| 2009/0289638 A1 | * | 11/2009 | Farinelli ............ | B82Y 10/00 257/E39.012 |
| 2018/0254693 A1 | * | 9/2018 | Serghine ............ | H02K 44/08 |
| 2019/0214971 A1 | * | 7/2019 | Keane ................ | H10N 60/805 |
| 2020/0350880 A1 | * | 11/2020 | Miano ................ | H10N 60/12 |

OTHER PUBLICATIONS

Chang, et al.: "A Fast and Large Bandwidth Superconducting Variable Coupler"; arxiv.org, Cornell University Library, 201 Olin Library Cornell University Ithaca, NY 14853, Nov. 18, 2020 (Nov. 18, 2020), XP081817245 (Year: 2020).*

(Continued)

*Primary Examiner* — Sibin Chen
(74) *Attorney, Agent, or Firm* — Tarolli, Sundheim, Covell & Tummino LLP

(57) ABSTRACT

A superconducting AC switch system includes a switch network configuration comprising a Josephson junction (JJ) coupled to a transmission line having a transmission line impedance, and a magnetic field generator that is configured to switch from inducing a magnetic field in a plane of the JJ, and providing no magnetic field in the plane of the JJ. An AC input signal applied at an input of the switch network configuration is passed through to an output of the switch network configuration in a first magnetic state, and substantially reflected back to the input of the switch network configuration in a second magnetic state. The first magnetic state is one of inducing and not inducing a magnetic field in a plane of the JJ, and the second magnetic state is the other of inducing and not inducing a magnetic field in a plane of the JJ.

20 Claims, 7 Drawing Sheets

(56) References Cited

OTHER PUBLICATIONS

Naaman, et al.: "On-Chip Josephson Junction Microwave Switch"; Appl. Phys. Lett. 108, 112601 (2016); https://doi.org/10.1063/1.4943602; Submitted: Dec. 7, 2015. Accepted: Jan. 21, 2016 . Published Online: Mar. 14, 2016.

Borodulin, et al.: "Operation of a Latching, Low-Loss, Wideband Microwave Phase-Change Switch Below 1 K"; Journal of Low Temperature Physics (2019) 194:273-284; https://doi.org/10.1007/s10909-018-2096-8.

Chang, et al.: "A Fast and Large Bandwidth Superconducting Variable Coupler"; arxiv.org, Cornell University Library, 201 Olin Library Cornell University Ithaca, NY 14853, Nov. 18, 2020 (Nov. 18, 2020), XP081817245.

Extended European Search Report (EESR) for corresponding EP 22180342.2 dated Nov. 21, 2022.

\* cited by examiner

SUPERCONDUCTING AC SWITCH SYSTEM

GOVERNMENT INTEREST

The invention was made under Government Contract. Therefore, the US Government has rights to the invention as specified in that contract.

TECHNICAL FIELD

The present invention relates generally to superconducting circuits, and more particularly to a superconducting AC switch system.

BACKGROUND

Conventional microwave mechanical, electro-mechanical, and electronic switches may not be compatible with on-chip integration and cryogenic operation of superconducting electronic circuits, because of incompatible fabrication processes and high power dissipation. Likewise, tunable filters that are commonly realized by use of either active components such as voltage-variable capacitors i.e. varactors, mechanical drivers, or ferroelectric and ferrite materials, are not easily controllable by signal levels that can be generated with single flux quantum (SFQ) technologies, and many are not operable at cryogenic temperatures. While superconducting microwave filters, both fixed and tunable, have been previously realized using both high temperature and low temperature superconductors, their use in switching applications suffered from high return loss, limited usable bandwidth, and poor out-of-band off-state isolation.

SUMMARY

In one example, a superconducting AC switch system is provided that comprises a switch network configuration comprising a Josephson junction (JJ) coupled to a transmission line having a transmission line impedance, and a magnetic field generator that is configured to switch from inducing a magnetic field in a plane of the JJ, and providing no magnetic field in the plane of the JJ. An AC input signal applied at an input of the switch network configuration is passed through to an output of the switch network configuration in a first magnetic state, and the AC input signal applied at the input of the switch network configuration is substantially reflected back to the input of the switch network configuration in a second magnetic state. The first magnetic state is one of inducing a magnetic field in a plane of the JJ, and providing no magnetic field in the plane of the JJ, and the second magnetic state is the other of inducing a magnetic field in a plane of the JJ, and providing no magnetic field in the plane of the JJ.

In another example, a superconducting AC switch system comprises a switch network configuration comprising a plurality of switch network circuits each having a respective Josephson junction (JJ) coupled to a respective transmission line having a respective transmission line impedance, and a switch controller configured to control the selective switching of inducing a magnetic field in a plane of a respective JJ and providing no magnetic field in a plane of a respective JJ for each respective JJ of the plurality of switch network circuits. The inducing of a magnetic field in a plane of a respective JJ provides the JJ with an impedance larger than the transmission line impedance of its respective transmission line and the providing of no magnetic field in a plane of a respective JJ allows the JJ to superconduct and have an impedance smaller than the transmission line impedance of its respective transmission line. The switch controller is configured to select a selected one or more of the plurality of switch networks to pass a received AC input signal to the output of the selected switch network circuit, while blocking the passing of a received AC input signal through non-selected switch network circuits of the plurality of switch network circuits.

DETAILED DESCRIPTION

Figure 1:
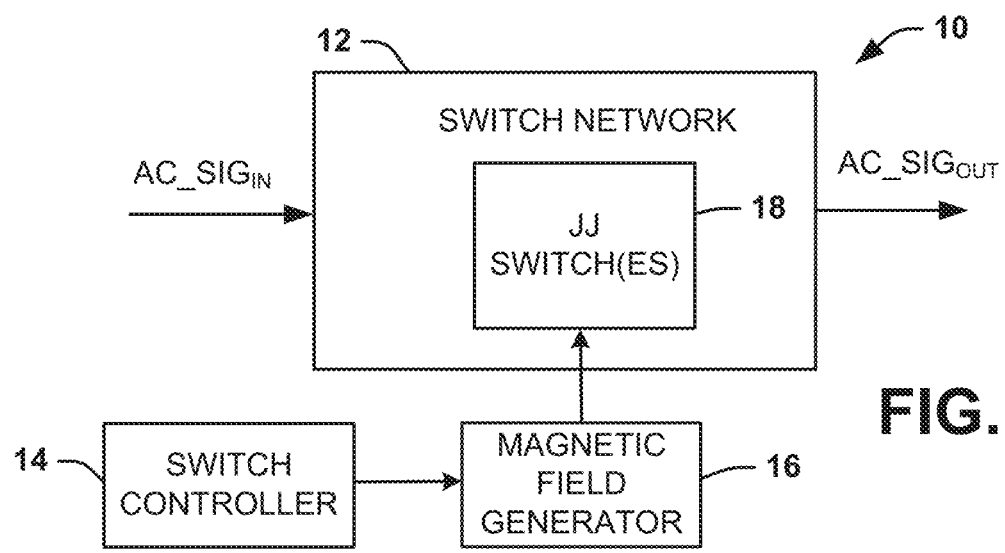
FIG. 1 illustrates a schematic block diagram of a superconducting AC switch system.

The present disclosure relates generally to superconducting circuits, and more particularly to a superconducting AC switch system. The superconducting AC switch system provides an on-chip microwave switch to facilitate the routing of RF and microwave signals across superconducting integrated circuits and/or to modulate the coupling between circuit elements therein. In a variety of superconducting electronics applications, it is desirable to tune the coupling at microwave frequencies between two circuit elements by way of applying a control signal. It is also desirable in many applications to insert a microwave signal into a test apparatus which is routed to one of many loads on a chip by way of a switch matrix. This superconducting AC switch system provides a microwave switch architecture that can be integrated on chip that can provide both of these capabilities.

The switch system is comprised of standard superconducting materials and devices, and so eliminates the need for both external switching electronics and additional fabrication process complexity. The switch system leverages the tunable impedance provided by a Josephson junction whose critical current can be modulated by the locally-generated magnetic field from an on chip bias line or solenoid. An on/off ratio greater than 20 dB is demonstrated over a frequency range from DC up to 15 GHz, with additional circuitry demonstrated to implement band-pass functionality. The switch system can be extended from having single pole, single-throw functionality to single-pole, multi-throw functionality. In one example, the switch within the switch system is a JJ enclosed by an isolated on-chip solenoid, or other otherwise coupled to a suitable bias line, that when current-biased will generate a localized magnetic field oriented in the plane of the JJ.

A JJ can be enclosed by an isolated on-chip solenoid, or otherwise coupled to a suitable bias line, that when current-biased will generate a localized magnetic field oriented in the plane of the junction. With no current bias, the magnitude of the impedance of the junction at a frequency co is well approximated by $|Zj|=\omega*Lj=\omega*\phi_0/2\pi*Ic$, where $Lj$ is the Josephson inductance and (Do is the magnetic flux quantum. In this case, the effective impedance of the junction is much lower than most transmission line impedances and the junction effectively behaves like a short circuit. A typical transmission line impedance is from about 20 ohms to about 75 ohms (e.g., 50 ohms). But at a current bias sufficient to suppress the critical current of the junction, the impedance is given by the parallel combination of the internal junction resistance and the junction capacitance. For low enough frequencies, the impedance of the internal junction resistance dominates and is larger in magnitude than most transmission line impedances. This provides a Josephson junction with a current-tunable impedance $Zj$. Alternatively, a shunt resistor may be included in parallel with the junction, which makes the impedance when the critical current is suppressed in this case the parallel combination of the junction internal resistance, capacitance, and shunt resistance to configure a filter. Other impedance components such as capacitors, inductors and/or resistors can be placed in parallel with the JJ to provide a desired filter configuration.

In one example, a superconducting AC switch system is provided. The superconducting AC switch system comprises a switch network configuration with one or more Josephson junctions (JJs), and a magnetic field generator that is configured to switch from inducing a magnetic field in a plane of the one or more JJs, and providing no magnetic field in the plane of the one or more JJs. In one example, the one or more JJs are arranged in series with an input terminal or port (hereinafter referred to as input) and an output terminal or port (hereinafter referred to as output) through transmission line portions. An AC input signal applied at the input of the AC switch system passes through to the output of the AC switch system through the one or more JJs in the absence of the magnetic field, and the AC input signal is reflected back to the input in the presence of the magnetic field.

In another example, a superconducting AC switch system comprises a switch network configuration with one or more JJs arranged in parallel between an input and an output. The one or more JJs have a first end coupled to an intermediate point of a transmission line between the input and the output, and a second end coupled to ground. An AC input signal applied at the input of the AC switch system passes to the output of the AC switch system in the presence of an induced magnetic field through the one or more JJs since the one or more JJs provide an impedance to ground that is substantially higher than typical transmission line impedances, and the AC input signal is reflected back to the input of the AC switch system in the absence of the magnetic field through the one or more JJs, since the one or more JJs superconduct and short the intermediate point to ground.

For example, a JJ can have an impedance that is larger (e.g., 2 times larger) than its associated transmission line when a magnetic field is induced in the plane of the JJ. It can further be desirable if the JJ has an impedance substantially larger (e.g., 10 times to a 100 times larger) than its associated transmission line when a magnetic field is induced in the plane of the JJ. Additionally, a JJ can have an impedance that is smaller (e.g., 2 times smaller) than its associated transmission line when a magnetic field is not induced in the plane of the JJ. It can further be desirable if the JJ has an impedance substantially smaller (e.g., 10 times to a 100 times smaller) than its associated transmission line when a magnetic field is not induced in the plane of the JJ. When a JJ is superconducting, its impedance is treated as if it is 0 ohms, but it typically is about 0.01 ohms to about 0.1 ohms for most junction parameters. When the critical current is suppressed, the junction impedance goes up to about 100 ohms to about 1000 ohms or more, depending on frequency and junction parameters.

FIG. 1 illustrates a schematic block diagram of a superconducting AC switch system 10. The superconducting AC switch system 10 includes a switch network configuration 12 having one or more JJ switches 18. Each JJ switch is formed from a single Josephson junction. The one or more JJ switches 18 can be grouped together in parallel to increase the maximum power of the AC signal in the on state without the need to increase the size of the JJs, or grouped together in series to increase the impedance in the off state A switch controller 14 controls the absence or presence of a magnetic field induced by a magnetic field generator 16. The magnetic field generator 16 can be a solenoid or a suitable bias line. Each of the one or more JJ switches can be switched between a large impedance state (e.g., 100 to 1000 ohms) and a substantially low impedance state (e.g., 0.01 to 0.1 ohms) based on the absence and presence of the induced magnetic field by the magnetic field generator 16. For a series switch network configuration, an AC signal (AC_SIG$_{IN}$) at an input passes through the switch network configuration 12 via the one or more JJ switches 18 to an output to provide an output signal (SIG$_{OUT}$), since the one or more JJs are superconducting and provide a substantially small impedance. In the large impedance state, the AC signal (SIG$_{IN}$) is substantially reflected back to the input of the switch network configuration 12 since the critical current of the JJs within the one or more JJ switches are suppressed causing a large impedance between the input and the output and reflection of the AC signal.

For a parallel switch network configuration, the opposite situation occurs. That is for a parallel configuration, an AC signal (AC_SIG$_{IN}$) passes through the switch network configuration 12 via the one or more JJ switches 18 to an output as SIG$_{OUT}$ in the large impedance state since a large impedance to ground is provided between the input and output. In the substantially small impedance state, the AC signal (SIGN) is substantially reflected back to the input of the switch network configuration 12 since the one or more JJ switches are superconducting to ground causing a short to ground of the circuit and reflection of the AC signal back to the input.

Figure 2:
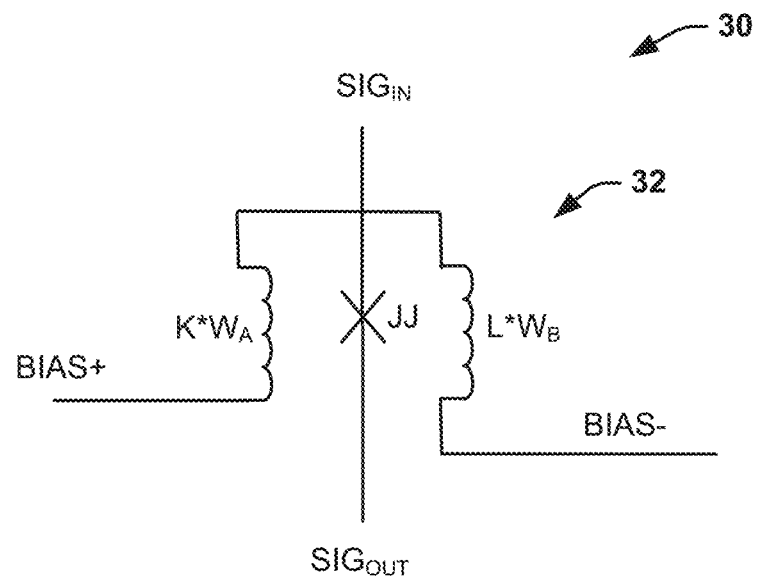
FIG. 2 illustrates a schematic diagram of an example of an AC switch system formed from a single JJ that is a controlled by a solenoid that acts as a magnetic field generator to induce a magnetic field.

FIG. 2 illustrates a schematic diagram of an example of an AC switch system 30 formed from a single JJ that is a controlled by a solenoid 32 that acts as a magnetic field generator to induce a magnetic field. The solenoid 32 is represented schematically by one or more first windings designated as K*W$_1$, where K is the number of first windings W$_1$ and K is an integer greater than or equal to one. The solenoid 32 also includes one or more second windings designated as L*W$_2$, where L is the number of second windings W$_2$ and L is an integer greater than or equal to one. In an integrated circuit structure, each of the first and second windings would span a top and bottom layer, and the JJ would be in an intermediate layer. The solenoid would be formed with a repetition of ends of first windings connecting with ends of second windings in a loop winding configuration that substantially surrounds the JJ.

A bias current, applied through BIAS+ input and exiting the BIAS− output, runs through the loop winding generating a magnetic field oriented in the plane of the JJ and suppresses the critical current of the JJ, which in turn substantially reflects an AC input current that is provided at an input SIG$_{IN}$ of the JJ from flowing at an output SIG$_{OUT}$ of the JJ. With no bias current running through the loop winding, the JJ superconducts and the AC current provided at the input SIG$_{IN}$ passes to the output SIG$_{OUT}$ without substantial reflection.

Figure 3:
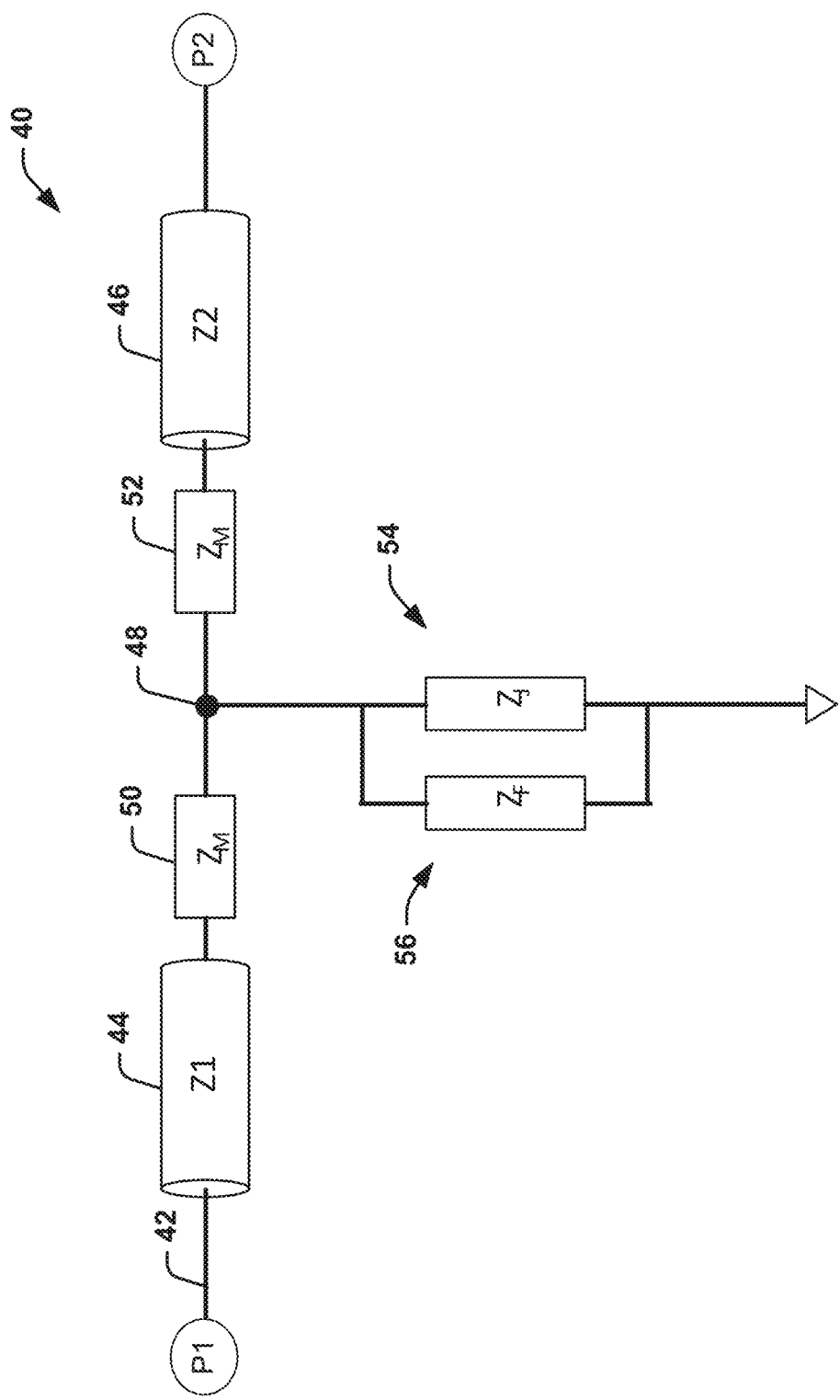
FIG. 3 illustrates a schematic example of a parallel switch network configuration.

FIG. 3 illustrates a schematic example of a parallel switch network configuration 40. The parallel switch network configuration 40 includes a transmission line 42 coupled between a first port (P1) and a second port (P2). The transmission line 42 includes a first transmission line portion 44 having impedance Z1 and a second transmission line portion 46 having an impedance Z2. The first transmission line portion 44 is coupled between the first port (P1) and an intermediate point 48, and the second transmission line 46 is coupled between the intermediate point 48 and the second port (P2). Depending on the particular parameters of the circuit, impedance matching or transformer networks Z$_M$ may be optionally included as indicated by components 50 and 52. Also, a tunable JJ 54 with impedance Zj is connected to the intermediate point 48 in between the first and second transmission line portions 44 and 46, respectively, and is grounded on the opposite end.

An optional filter circuit 56 with impedance ZF may be included along with the junction. The inclusion of the lumped element Zj presents an impedance discontinuity, and assuming that Z1=Z2=ZT, the transmission coefficient can be derived from basic transmission line theory as T=2Zj/(ZT+2Zj). From this expression, the transmission coefficient approaches zero if the junction presents a superconducting path to ground (i.e. the critical current is not suppressed) and an AC signal through the switch network configuration from the first port (P1) to the second port (P2) approaches zero, while transmission approaches unity if the critical current is suppressed and the impedance Zj becomes sufficiently large with respect to the transmission line impedance ZT and an AC signal through the switch network configuration from from the first port (P1) to the second port (P2) approaches unity.

Figure 4:
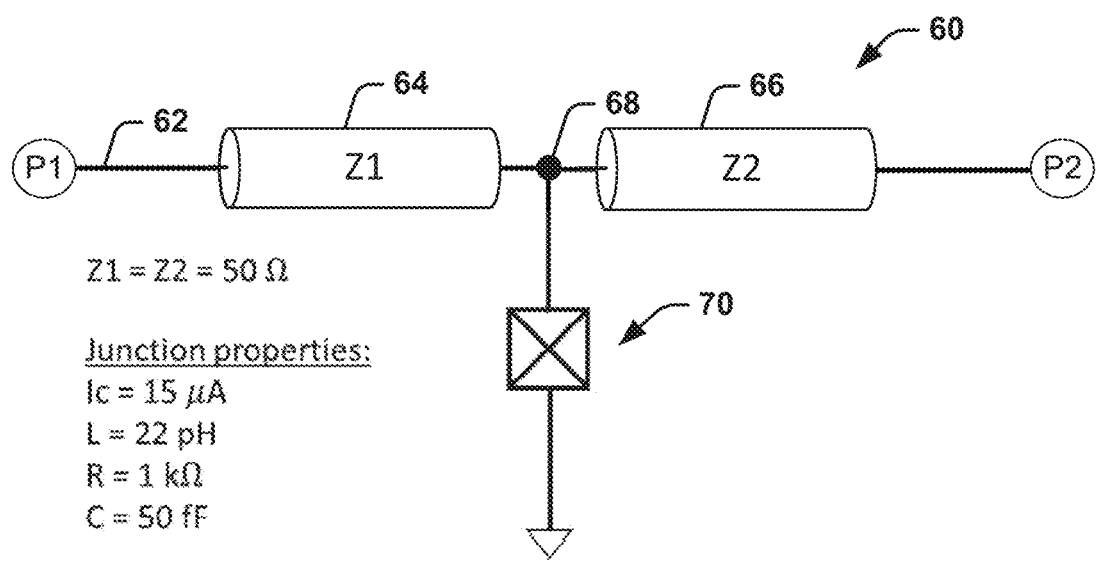
FIG. 4 illustrates another schematic example of a parallel switch network configuration.

FIG. 4 illustrates another schematic example of a parallel switch network configuration 60. The parallel switch network configuration 60 includes a transmission line 62 coupled between a first port (P1) and a second port (P2). The transmission 62 line includes a first transmission line portion 64 having impedance Z1 and a second transmission line portion 66 having an impedance Z2. The first transmission line portion 64 is coupled between the first port (P1) and an intermediate point 68 and the second transmission line portion 66 is coupled between the intermediate point 68 and the second port (P2). The impedance Z1 and the impedance Z2 can each be substantially equal to 50 ohms. A "tunable Josephson impedance" block 70 is represented by an 'X' block and is coupled between the intermediate point 68 and ground to form a bare filter. The 'X' block corresponds to a Josephson junction 70 enclosed in an on-chip solenoid or otherwise coupled to an on-chip bias line that can suppress the junction's critical current (I$_C$) to zero. The Josephson junction has the following properties: I$_C$=15 µA; L=22 pH; R=1 KΩ; C=50 fF.

Figure 5:
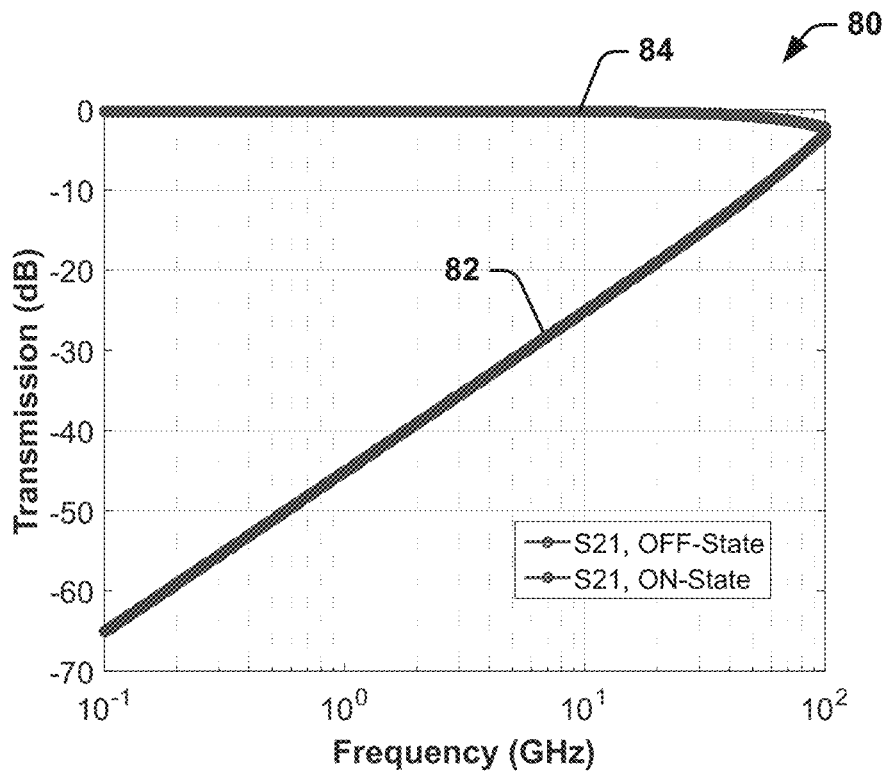
FIG. 5 illustrates a graph of circuit output from a SPICE simulation of signal transmission from the first port (P1) to the second port (P2) of the parallel switch network configuration of FIG. 4.

FIG. 5 illustrates a graph 80 of circuit output from a SPICE simulation of signal transmission from the first port (P1) to the second port (P2) of the parallel switch network configuration of FIG. 4. The Josephson junction 70 simulated has a critical current of 15 µA, a Josephson inductance of 22 pH, a capacitance of 50 fF, and an internal resistance of 1Ω when its critical current is suppressed. As illustrated in the graph 80, with no suppression of the critical current, Zj presents an inductive short to ground, and the transmission S21 is less than −20 dB for frequencies below 15 GHz, as shown in curve 82. When the critical current is suppressed, the large internal junction resistance ensures significant transmission (>−1 dB) for frequencies up to 15 GHz, as shown in the curve 84. From DC to 15 GHz, an on/off ratio in excess of 20 dB is exhibited.

Figure 6:
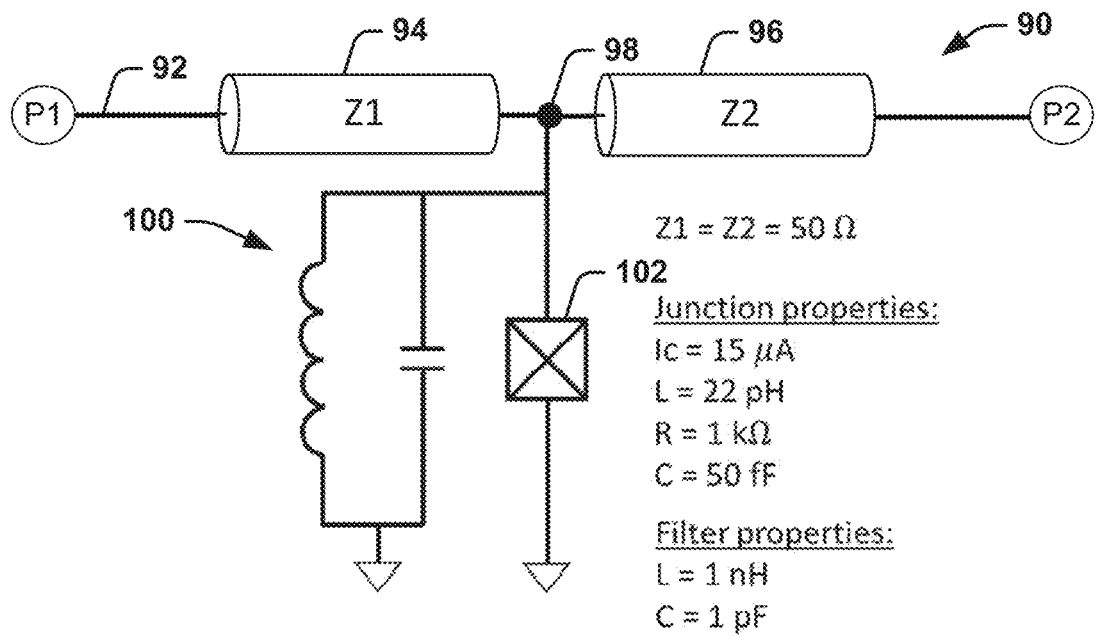
FIG. 6 illustrates yet another schematic example of a parallel switch network configuration.

FIG. 6 illustrates yet another schematic example of a parallel switch network configuration 90. The parallel switch network configuration 90 includes a transmission line 92 coupled between a first port (P1) and a second port (P2). The transmission line 92 includes a first transmission line portion 94 having impedance Z1 and a second transmission line portion 96 having an impedance Z2. The first transmission line portion 94 is coupled between the first port (P1) and an intermediate point 98 and the second transmission line portion 96 is coupled between the intermediate point 98 and the second port (P2). The impedance Z1 and the impedance Z2 are each substantially equal to 50 ohms. A "tunable Josephson impedance" block is represented by an 'X' block and is coupled between the intermediate point and ground to form a bare filter. The 'X' block corresponds to a Josephson junction 102 enclosed in an on-chip solenoid or otherwise coupled to an on-chip bias line that can suppress the junction's critical current I$_C$ to zero. The Josephson junction 102 has the following properties: I$_C$=15 µA; L=22 pH; R=1 KΩ; C=50 fF. An added inductor L=1 nH and capacitor C=1 pF are provided in parallel with the Josephson junction 102 to form a filter circuit 100, that corresponds to the ZF block shown in FIG. 3, to provide a bandpass filter that is dependent on whether or not the critical current of the Josephson junction 102 is suppressed.

Figure 7:
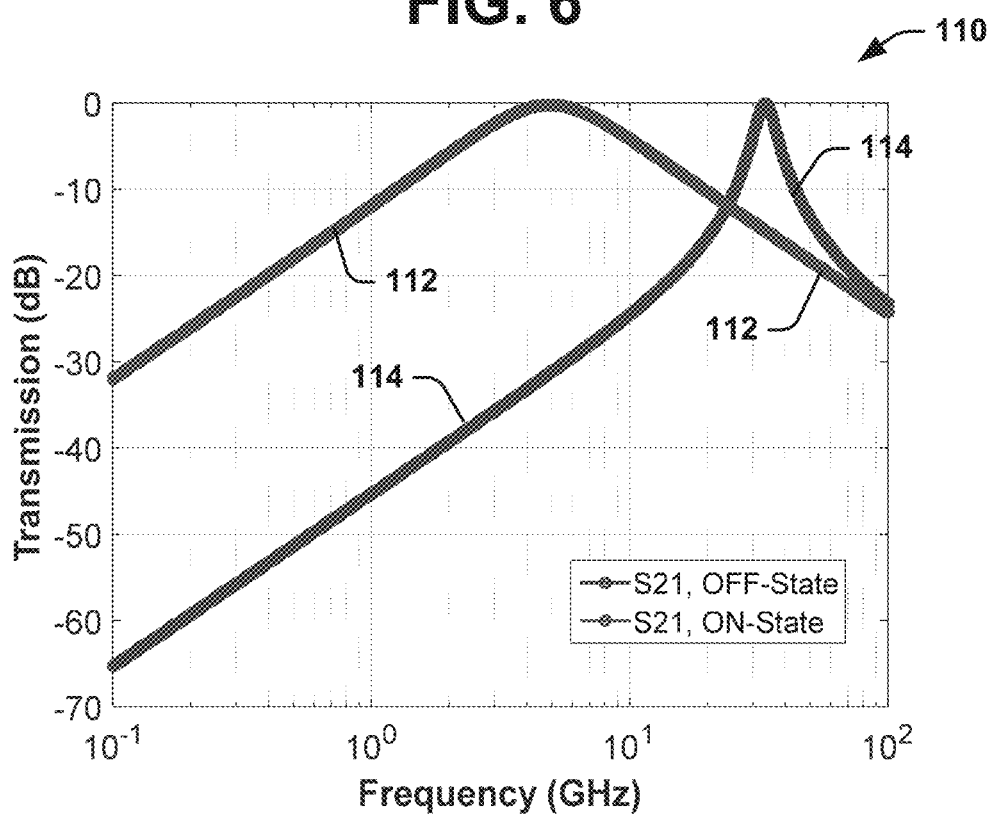
FIG. 7 illustrates a graph of circuit output from a SPICE simulation of signal transmission from a first port (P1) to a second port (P2) of the parallel switch network configuration of FIG. 6.

FIG. 7 illustrates a graph 110 of circuit output from a SPICE simulation of signal transmission from port 1 to port 2 of the parallel switch network configuration of FIG. 6. The graph 110 illustrates a circuit that is effectively a band-pass filter with a tunable resonant frequency depending on whether or not the critical current of the junction has been suppressed. In this circuit, the capacitance and inductance shunting the junction have been chosen to give maximum transmission at a frequency of 5 GHz in the ON state, as shown in curve 112. In the OFF state, transmission is well below −20 dB for all frequencies below 15 GHz as illustrated in curve 114. By tuning the filter and junction parameters, these frequencies can be adjusted as needed.

Figure 8:
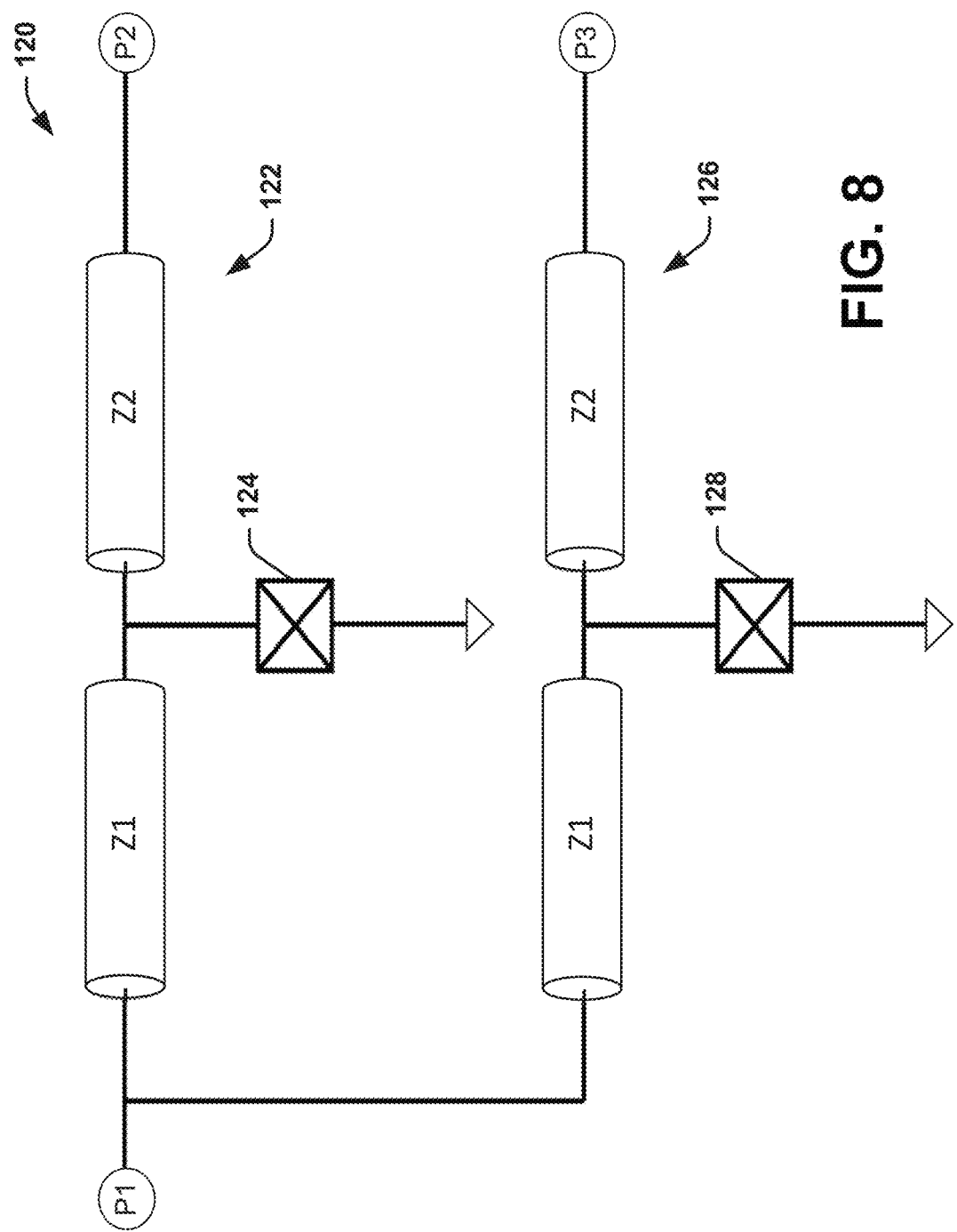
FIG. 8 illustrates an example schematic diagram of a single-pole-double throw (SPDT) microwave switch formed from two parallel switch network circuits of FIG. 3.

Multiple parallel switch network circuits can be configured to build 1-N switches or N-1 switches/multiplexers. FIG. 8 illustrates an example schematic diagram of a single-pole-double throw (SPDT) microwave switch 120 formed from two parallel switch network circuits of FIG. 3. The SPDT microwave switch 120 couples a first port (P1) to a second port (P2) through a first parallel switch network 122 and couples the first port (P1) to a third port (P3) through a second parallel switch network 126. This is a shunt SPDT switch which requires that the electrical lengths of the Z1 transmission lines be designed such that they are a quarter of the wavelength of the desired operating frequency (otherwise all signals will be rejected). An AC input signal provided at the first port (P1) can be routed to the second port (P2) when a magnetic field is induced in a Josephson junction 124 of the first parallel switch network circuit 122 and a magnetic field is not induced in a Josephson junction 128 of the second parallel network circuit 126. Alternatively, an AC input signal provided at the first port (P1) can be routed to the third port (P3) when a magnetic field is not induced in the Josephson junction 124 of the first parallel switch network circuit 122 and a magnetic field is induced in the Josephson junction 128 of the second parallel network circuit 126. It is appreciated that the switch 120 of FIG. 8 could be configured as a multiplexor by providing the parallel network circuits with dedicated inputs and connected outputs as opposed to providing the circuits with connected inputs and dedicated outputs in the 1-N switch configuration of FIG. 8.

Figure 9:
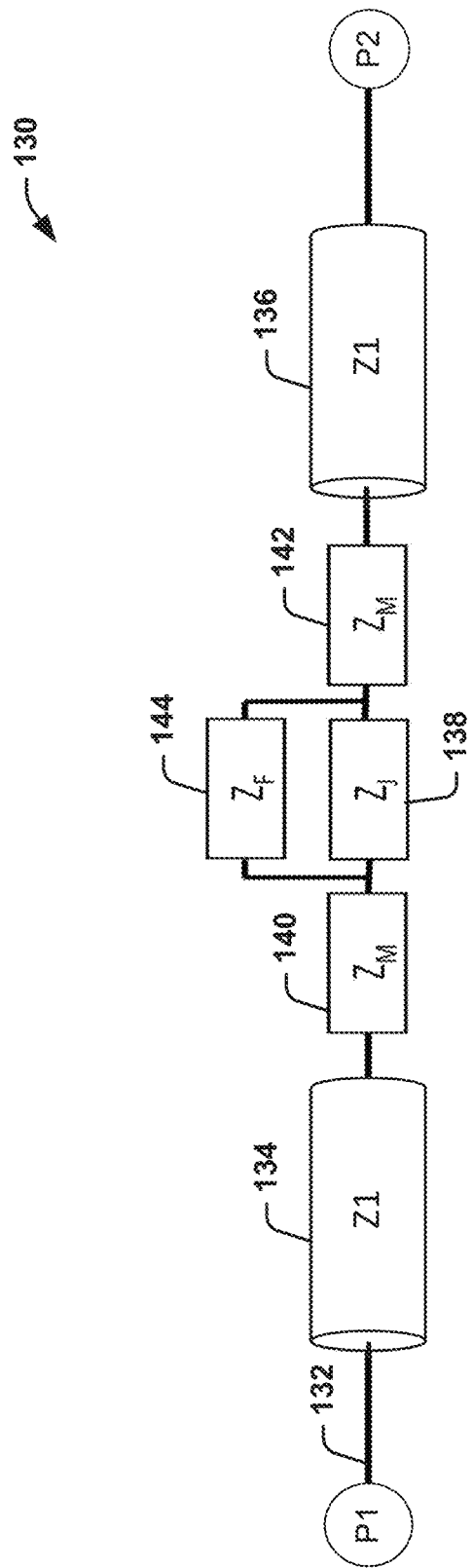
FIG. 9 illustrates a schematic example of a series switch network configuration.

An alternative switch design is a series switch configuration in which the tunable Josephson impedance is now placed in series with the two transmission lines, rather than as a short to ground. FIG. 9 illustrates a schematic example of a series switch network configuration 130. The series switch network configuration 130 includes a transmission line 132 coupled between a first port (P1) and a second port (P2). The transmission line 132 includes a first transmission line portion 134 having impedance Z1 and a second transmission line portion 136 having an impedance Z2. The first transmission line portion 134 is coupled between the first port (P1) and a first end of a tunable Josephson junction 138 with impedance Zj and the second transmission line portion 136 is coupled between a second end of the tunable Josephson junction 136 and the second port (P2). An optional filter circuit 144 with impedance $Z_F$ may be included along with the junction. Depending on the particular parameters of the circuit, impedance matching or transformer networks $Z_M$ may be optionally included, and labeled as 140 and 142. In this case, when the Josephson junction 138 is superconducting, it facilitates transmission from the first port (P1) to the second port (P2), while the suppression of the critical current of the Josephson junction 138 increases its impedance with respect to the transmission line impedance and leads to significant reflection of the input signal from the first port (P1) back to the first port (P1).

Figure 10:
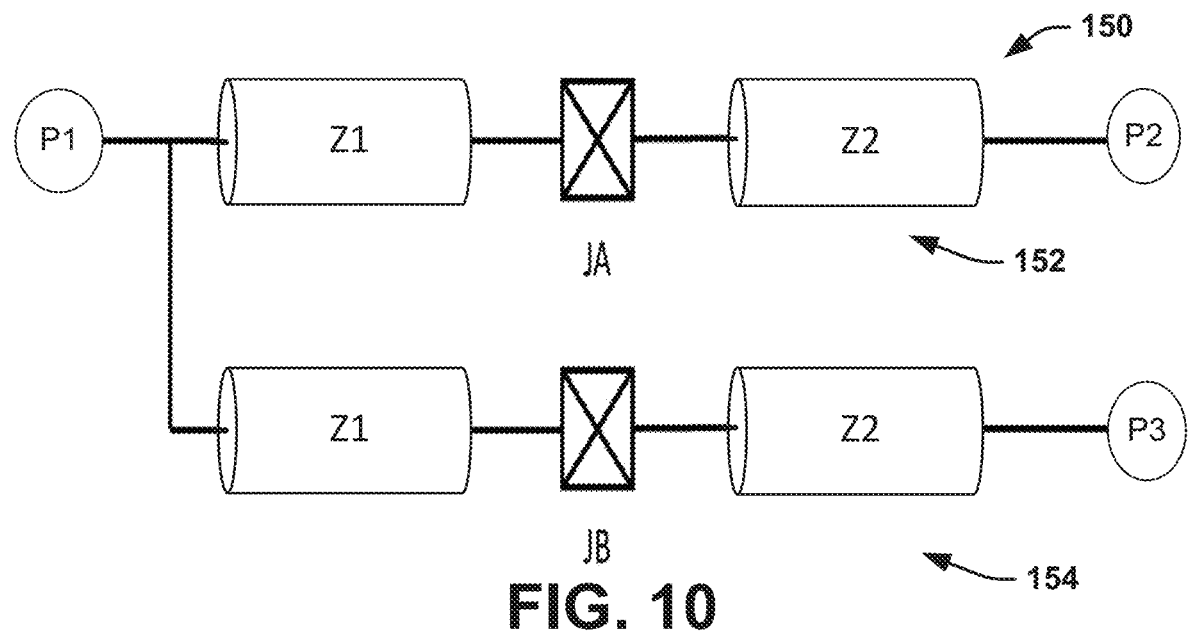
FIG. 10 illustrates an example schematic diagram of a single-pole-double throw (SPDT) microwave switch formed from two series switch network circuits of FIG. 9.

An advantage that this in-line architecture provides is that it allows the switch to be easily expanded from a single-pole-single-throw switch into a single-pole switch with an arbitrary number of throws without having to precisely engineer the electrical lengths of the Z1 transmission lines. FIG. 10 illustrates an example schematic diagram of a single-pole-double throw (SPDT) microwave switch 150 formed from two series switch network circuits of FIG. 9. The SPDT microwave switch 150 couples a first port (P1) to a second port (P2) through a first series switch network 152 having an in-line Josephson junction (JA) and couples the first port (P1) to a third port (P3) through a second series switch network 154 having an in-line Josephson junction (JB). In this switch 150, an input signal at the first port (P1) is to be routed either to the second port (P2) or the third port (P3) based on which of the switch networks are selected. A series switch network is turned on by not inducing a magnetic field in its respective JJ and allowing the respective series switch network to superconduct, and turning the other series switch network off by inducing a magnetic field in its respective JJ. It is appreciated that the switch 150 of FIG. 10 could be configured as a multiplexor by providing the series network circuits with dedicated inputs and connected outputs as opposed to providing the circuits with connected inputs and dedicated outputs in the 1-N switch configuration of FIG. 10.

Figure 11:
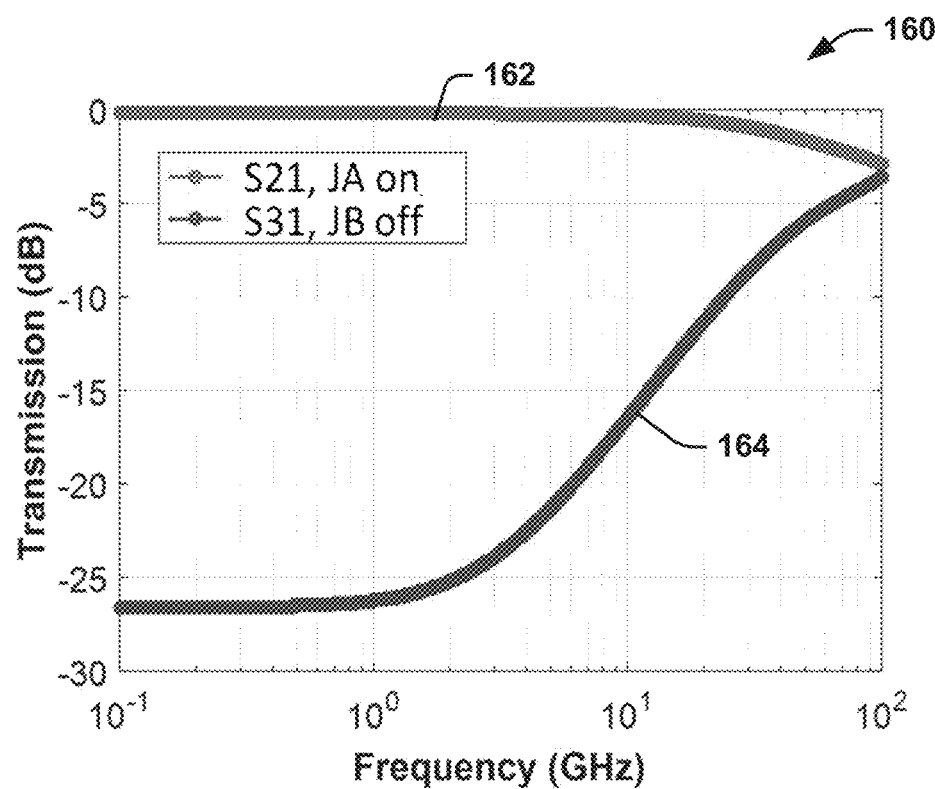
FIG. 11 illustrates a graph of circuit simulation output results from a signal transmission from first port (P1) to second port (P2) as illustrated in the curve (S21), while signal transmission is suppressed from the third port (P3) as illustrated in curve (S31).

FIG. 11 illustrates a graph 160 of circuit simulation output results from a signal transmission from the first port (P1) to second port (P2) as illustrated in curve (S21) 162, while signal transmission is suppressed at the third port (P3), as illustrated in curve (S31) 164. In the simulation results shown in the graph 160, the Josephson junction JA is superconducting while the Josepshon junction JB has had its critical current suppressed and presents a significantly higher impedance. Accordingly, nearly all of the input signal is transmitted to the second port (P2), while the transmission coefficient with the third port (P3) has an output that is less than −15 dB for frequencies below 10 GHz. The simulations above assume Z1=Z2=Z=50 Ohms, but a lower transmission line impedance will lead to even higher on/off ratios. Accordingly, a matching impedance ($Z_M$) could be designed to function as an impedance transformer to place Z1 into a lower impedance environment and thus improve the performance of the given switch.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A superconducting AC switch system comprising:
    a parellel switch network comprising a Josephson junction (JJ) coupled at a first end to an intermediate point in a transmission line having a transmission line impedance and at a second end to ground; and
    a magnetic field generator that is configured to switch from inducing a magnetic field in a plane of the JJ, and providing no magnetic field in the plane of the JJ,
    wherein an AC input signal applied at an input of the parallel switch network is passed through to an output of the parallel switch network in a first magnetic state, and the AC input signal applied at the input of the parallel switch network is substantially reflected back to the input of the parallel switch network in a second magnetic state,
    wherein the first magnetic state is one of inducing a magnetic field in a plane of the JJ, and providing no magnetic field in the plane of the JJ, and the second magnetic state is the other of inducing a magnetic field in a plane of the JJ, and providing no magnetic field in the plane of the JJ.

2. The system of claim 1, wherein inducing a magnetic field in a plane of the JJ causes the JJ to have an impedance larger than the transmission line impedance and providing no magnetic field in the plane of the JJ allows the JJ to superconduct and have an impedance smaller than the transmission line impedance.

3. The system of claim 1, wherein the transmission line has a first transmission line portion coupled to the input of the parallel switch network and a second transmission line portion coupled to an output of the parallel switch network, wherein the JJ is disposed between the first transmission line portion at an end opposite the input and the second transmission line portion at an end opposite the output.

4. The system of claim 3, wherein the JJ superconducts and shorts the intermediate point to ground when no magnetic field is provided in the plane of the JJ and provides an impedance larger than the transmission line impedance when a magnetic field is induced in the plane of the JJ.

5. The system of claim 4, wherein the parallel switch network comprises a plurality of parallel switch network circuits each having a respective JJ coupled at a first end to an intermediate point in a respective transmission line and to ground on a second end, wherein each respective JJ superconducts and shorts the intermediate point to ground when no magnetic field is provided in the plane of the JJ and provides an impedance larger than the transmission line impedance when a magnetic field is induced in the plane of the JJ, wherein the magnetic field generator is configured to induce a magnetic field in a JJ of a selected one of the plurality of parallel switch network circuits and not the JJs in the non-selected ones of the plurality of switch network circuits, such that an AC signal provided at inputs of one or more of the plurality of parallel switch network circuits is provided at the output of the selected one of the plurality of parallel switch network circuits.

6. The system of claim 5, wherein the inputs of each of the plurality of parallel switch network circuits are connected to a same port and each output of the plurality of parallel switch network circuits are coupled to respective dedicated output ports.

7. The system of claim 5, wherein the inputs of each of the plurality of parallel switch network circuits are connected to respective dedicated ports and each output of the plurality of parallel switch network circuits are coupled to a same output port.

8. The system of claim 3, wherein the switch network configuration comprises a series switch network circuit, wherein the JJ has a first end connected to the first transmission line portion at an end opposite the input and the JJ has a second end connected to the second transmission line portion at an end opposite the output.

9. The system of claim 8, wherein the switch network configuration comprises a plurality of series switch network circuits each having a respective JJ coupled at a first end to a respective first transmission line portion of a respective transmission line and to a respective second transmission line portion of the respective transmission line, wherein the magnetic field generator is configured to induce magnetic fields in the JJs of each of the plurality of switch network circuits but a selected one of the plurality of switch network circuits such that a AC signal provided at inputs of one or more of the plurality of series switch network circuits is provided at the output of the selected one of the plurality of series switch network circuits.

10. The system of claim 9, wherein the inputs of each of the plurality of switch network circuits are connected to a same port and each output of the plurality of switch network circuits are coupled to respective dedicated output ports.

11. The system of claim 9, wherein the inputs of each of the plurality of switch network circuits are connected to respective dedicated ports and each output of the plurality of switch network circuits are coupled to a same output port.

12. The system of claim 1, wherein the induced magnetic field is selected to suppress the critical current of the JJ to substantially zero.

13. The system of claim 1, further comprising one or more additional impedance components configured in parallel with the JJ to provide a filter circuit that provides a filtered output response.

14. The system of claim 1, wherein the magnetic field generator is a solenoid with a loop winding that surrounds the one or more JJs.

15. The system of claim 1, wherein the magnetic field generator is a bias line in close enough proximity to the one or more JJs that when current-biased generates a sufficiently strong magnetic field in a plane of the one or more JJs so as to suppress the critical current substantially to zero.

16. A superconducting AC switch system comprising:
a parallel switch network comprising a plurality of parallel switch network circuits each having a respective Josephson junction (JJ) coupled at a first end to an intermediate point in a respective transmission line having a respective transmission line impedance, and a ground on a second end; and
a switch controller configured to control the selective switching of the inducing of a magnetic field in a plane of a respective JJ and the providing of no magnetic field in a plane of a respective JJ for each respective JJ of the plurality of parallel switch network circuits, wherein induction of a magnetic field in a plane of a respective JJ provides the JJ with an impedance larger than the transmission line impedance of its respective transmission line and the providing of no magnetic field in a plane of a respective JJ allows the JJ to superconduct and have an impedance smaller than the transmission line impedance of its respective transmission line, the switch controller configured to select a selected one or more of the plurality of parallel switch networks to pass a received AC input signal to the output of the selected parallel switch network circuit, while blocking the passing of a received AC input signal through non-selected parallel switch network circuits of the plurality of parallel switch network circuits.

17. The system of claim 16, wherein the respective JJ superconducts and shorts the intermediate point to ground when no magnetic field is provided in the plane of the respective JJ and provides an impedance larger than the transmission line impedance of its respective transmission line when a magnetic field is induced in the plane of the respective JJ.

18. The system of claim 16, wherein each of the switch network circuits are series switch network circuits, such that the respective JJ is coupled at a first end to a respective first transmission line portion of a respective transmission line and at a second end to a respective second transmission line portion of the respective transmission line.

19. The system of claim 16, wherein the inputs of each of the plurality of parallel switch network circuits are connected to a same port and each output of the plurality of parallel switch network circuits are coupled to respective dedicated output ports.

20. The system of claim 16, wherein the inputs of each of the plurality of parallel switch network circuits are connected to respective dedicated ports and each output of the plurality of parallel switch network circuits are coupled to a same output port.

* * * * *